(12) United States Patent
Watabe et al.

(10) Patent No.: US 12,327,725 B2
(45) Date of Patent: Jun. 10, 2025

(54) METHOD FOR MANUFACTURING GALLIUM OXIDE FILM

(71) Applicant: SHIN-ETSU CHEMICAL CO., LTD., Tokyo (JP)

(72) Inventors: Takenori Watabe, Annaka (JP); Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 743 days.

(21) Appl. No.: 17/299,051

(22) PCT Filed: Dec. 3, 2019

(86) PCT No.: PCT/JP2019/047268
§ 371 (c)(1),
(2) Date: Feb. 9, 2022

(87) PCT Pub. No.: WO2020/129625
PCT Pub. Date: Jun. 25, 2020

(65) Prior Publication Data
US 2022/0223406 A1    Jul. 14, 2022

(30) Foreign Application Priority Data

Dec. 18, 2018 (JP) ................. 2018-236030

(51) Int. Cl.
*H01L 21/02* (2006.01)
*C23C 16/40* (2006.01)
*C23C 16/448* (2006.01)

(52) U.S. Cl.
CPC .......... *H01L 21/0262* (2013.01); *C23C 16/40* (2013.01); *C23C 16/4481* (2013.01); *H01L 21/02565* (2013.01)

(58) Field of Classification Search
CPC .......... H01L 21/0262; H01L 21/02565; H01L 21/0242; H01L 21/02425; H01L 21/02576;
(Continued)

(56) References Cited

U.S. PATENT DOCUMENTS 6,794,275 B2 * 9/2004 Kondo .............. H01L 29/66765
257/E21.414
7,390,704 B2 * 6/2008 Tanaka .............. H01L 21/02422
257/E27.111
(Continued)

FOREIGN PATENT DOCUMENTS

CN      105986246 A    10/2016
CN      107068773 A     8/2017
(Continued)

OTHER PUBLICATIONS

Jul. 12, 2022 Office Action issued in Japanese Patent Application No. 2021-136607.
(Continued)

*Primary Examiner* — Dale E Page
*Assistant Examiner* — Quovaunda Jefferson
(74) *Attorney, Agent, or Firm* — Oliff PLC

(57) ABSTRACT

A method for manufacturing a gallium oxide film where a mist generated by atomizing a raw-material solution or by forming a raw-material solution into droplets is conveyed using a carrier gas, the mist is heated, and the mist is subjected to a thermal reaction on the substrate to form a film, whereas the raw-material solution, a raw-material solution containing at least a chloride ion and a gallium ion is used, and the mist is heated for 0.002 seconds or more and 6 seconds or less. This provides a method for manufacturing a α-gallium oxide film at low cost with excellent film forming speed.

19 Claims, 3 Drawing Sheets

(58) Field of Classification Search
CPC ......... H01L 21/02579; H01L 21/02581; H01L 21/02628; C23C 16/40; C23C 16/4481; C23C 16/448
See application file for complete search history.

(56) References Cited

U.S. PATENT DOCUMENTS

| | | | |
|---|---|---|---|
| 2009/0283029 | A1 | 11/2009 | Arena et al. |
| 2013/0047918 | A1* | 2/2013 | Bertram, Jr. ...... C23C 16/45591 117/88 |
| 2015/0225843 | A1 | 8/2015 | Oda et al. |
| 2016/0222511 | A1 | 8/2016 | Sasaki et al. |
| 2017/0179249 | A1* | 6/2017 | Oda .................. H01L 21/02565 |
| 2018/0061952 | A1 | 3/2018 | Tokuda et al. |
| 2019/0112703 | A1 | 4/2019 | Oda et al. |
| 2019/0157380 | A1 | 5/2019 | Fujita et al. |
| 2022/0049348 | A1 | 2/2022 | Oda et al. |
| 2022/0223406 | A1 | 7/2022 | Watabe et al. |

FOREIGN PATENT DOCUMENTS

| | | |
|---|---|---|
| EP | 3 480 841 A1 | 5/2019 |
| JP | H01-257337 A | 10/1989 |
| JP | 2004-224675 A | 8/2004 |
| JP | 2005-307238 A | 11/2005 |
| JP | 2010-510165 A | 4/2010 |
| JP | 2012-046772 A | 3/2012 |
| JP | 2013-028480 A | 2/2013 |
| JP | 5397794 B1 | 1/2014 |
| JP | 2014-063973 A | 4/2014 |
| JP | 2014-234337 A | 12/2014 |
| JP | 2016-146442 A | 8/2016 |
| JP | 2016-157878 A | 9/2016 |
| JP | 2017-069424 A | 4/2017 |
| JP | 2017-088454 A | 5/2017 |
| JP | 2018-070422 A | 5/2018 |
| JP | 2020-098846 A | 6/2020 |
| WO | 2018/004009 A1 | 1/2018 |

OTHER PUBLICATIONS

Jan. 18, 2023 Office Action issued in Taiwanese Patent Application No. 108146090.
Sep. 27, 2022 Extended European Search Report issued in European Patent Application No. 19898190.4.
Feb. 4, 2020 Search Report issued in International Patent Application No. PCT/JP2019/047268.
Jun. 16, 2021 International Preliminary Report on Patentability issued in International Patent Application No. PCT/JP2019/047268.
May 31, 2024 Office Action issued in Chinese Patent Application No. 201980083078.5.
Dec. 21, 2023 Office Action Issued in Korean Patent Application No. 10-2021-7017793.
Kawaharamura, "Physics on development of open-air atmospheric pressure thin film fabrication technique using mist droplets: Control of precursor flow," Japanese Journal of Applied Physics, 53, 2014, pp. 05FF08-1-05FF08-7.
Sep. 13, 2024 Office Action issued in European Patent Application No. 19 898 190.4.

* cited by examiner

[FIG. 1]
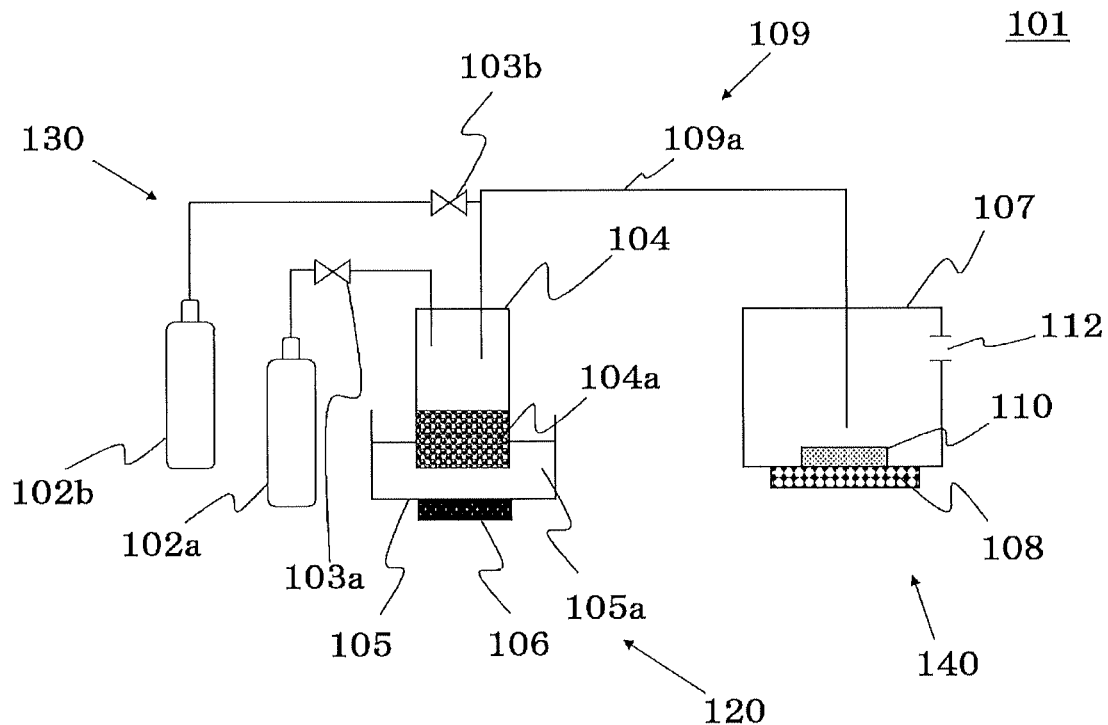
[FIG. 2]
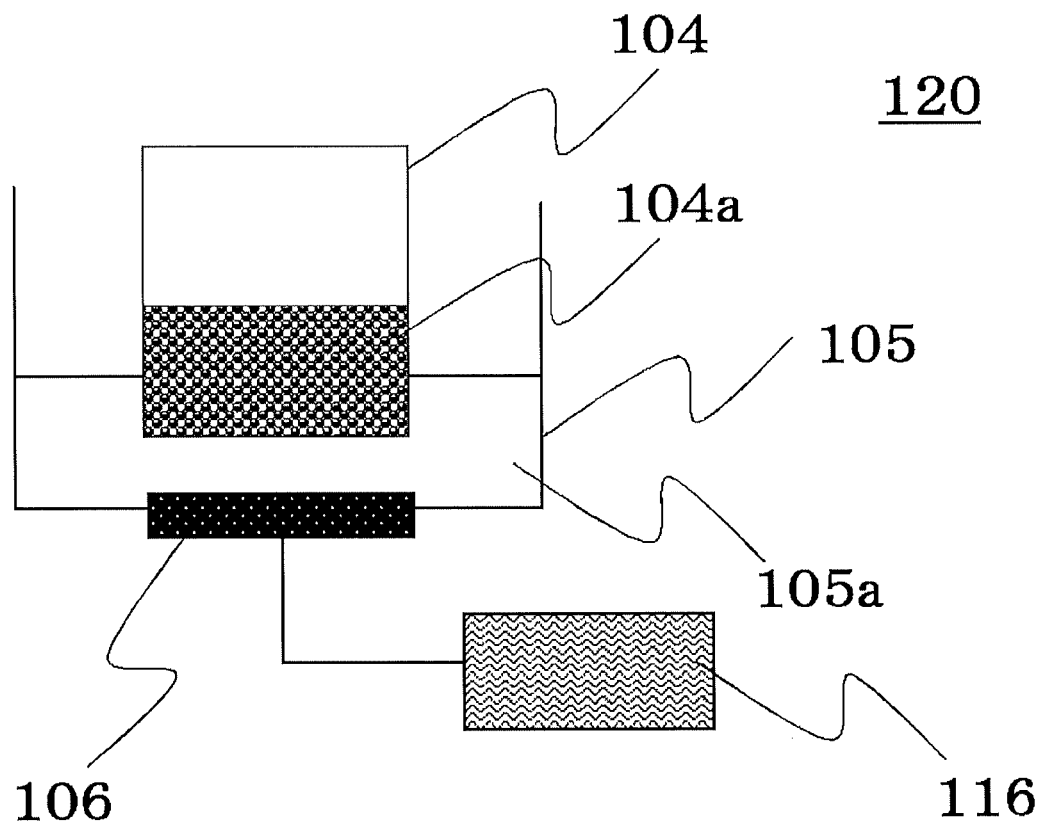

[FIG. 3]
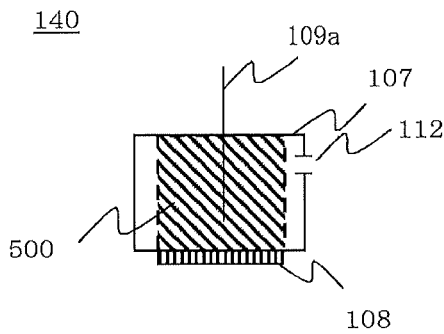
(a)
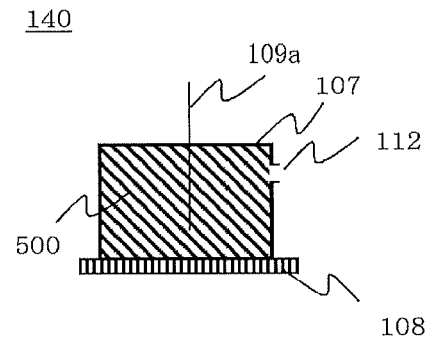
(b)
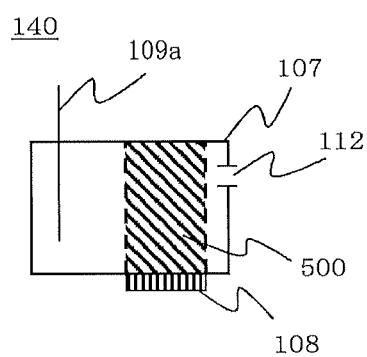
(c)
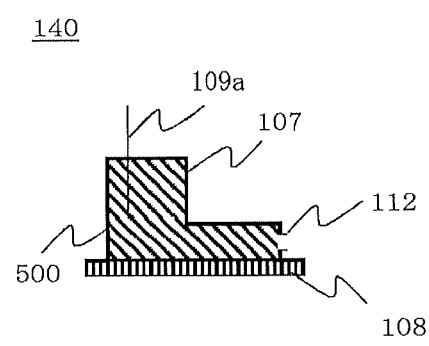
(d)
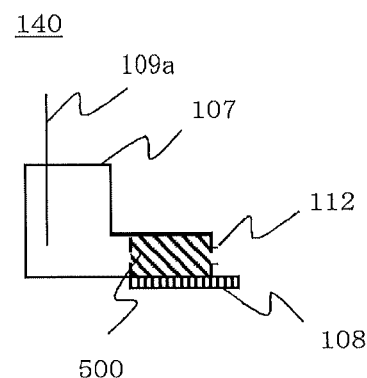
(e)

[FIG. 4]
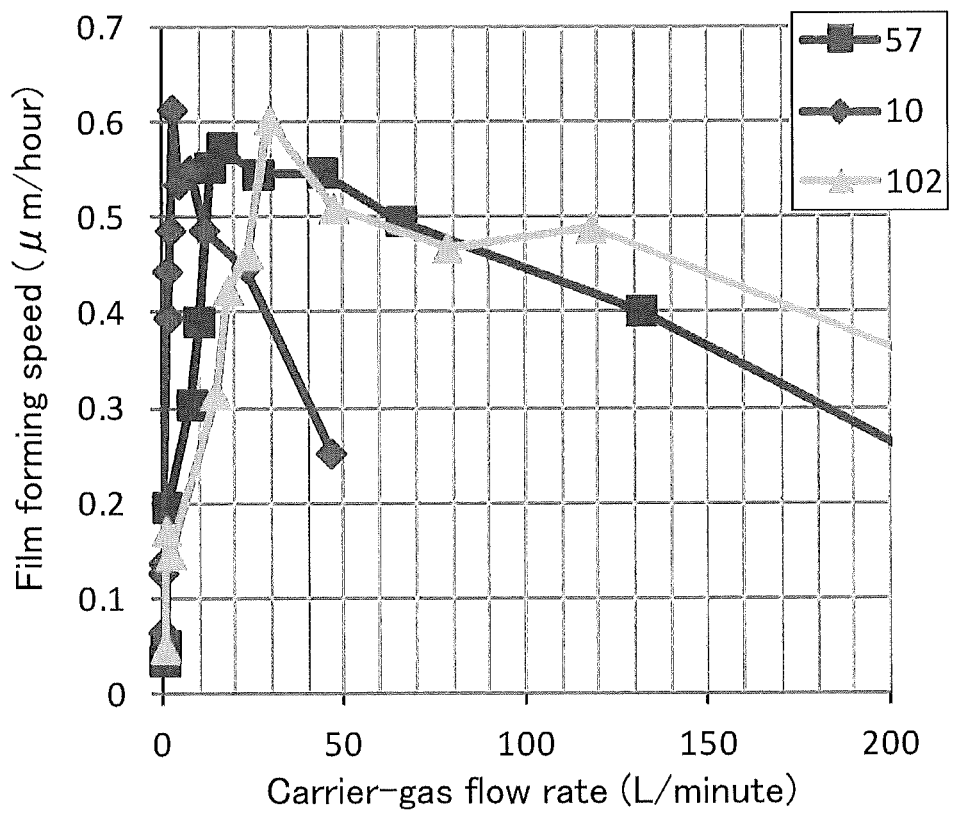
[FIG. 5]
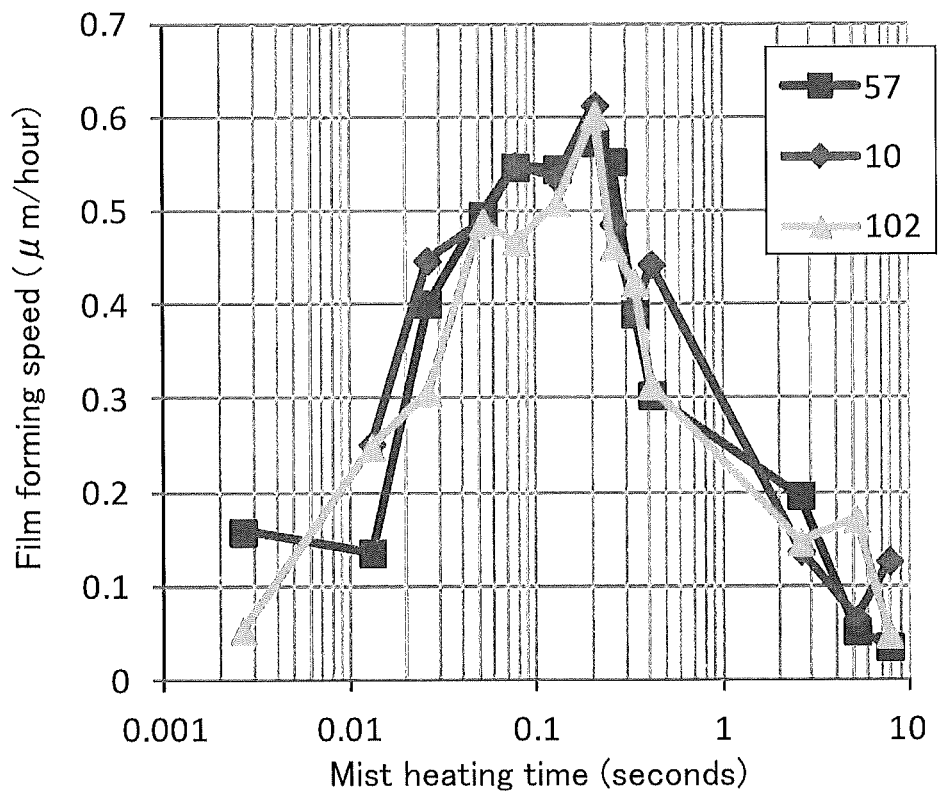

METHOD FOR MANUFACTURING GALLIUM OXIDE FILM

TECHNICAL FIELD

The present invention relates to a method for manufacturing a gallium oxide film on a substrate by using a raw material in a mist form.

BACKGROUND ART

Heretofore, there have been developed high-vacuum film forming apparatuses capable of achieving a non-equilibrium state in pulsed laser deposition (PLD), molecular beam epitaxy (MBE), sputtering, or other similar methods, and make it possible to manufacture oxide semiconductors, which have been impossible to manufacture by conventional melt method and so forth. In addition, Mist Chemical Vapor Deposition (Mist CVD. Hereinafter, this method may also be referred to as "mist CVD method") has been developed by which crystal is grown on a substrate using a raw material atomized into a mist form. This method enables production of corundum-structured gallium oxide (also noted as α-gallium oxide or α-$Ga_2O_3$). α-gallium oxide is expected to serve as a semiconductor having a large band gap, in the application to next-generation switching devices which can achieve high breakdown voltage, low loss, and high heat resistance.

In relation to mist CVD method, Patent Document 1 discloses a tubular furnace-type mist CVD apparatus. Patent Document 2 discloses a fine channel-type mist CVD apparatus. Patent Document 3 discloses a linear source-type mist CVD apparatus. Patent Document 4 discloses a tubular-furnace mist CVD apparatus, which is different from the mist CVD apparatus disclosed in Patent Document 1 in that a carrier gas is introduced into a mist generator. Patent Document 5 discloses a mist CVD apparatus in which a substrate is disposed above a mist generator and a susceptor is a rotary stage provided on a hot plate.

CITATION LIST

Patent Literature

Patent Document 1: JP H1-257337 A
Patent Document 2: JP 2005-307238 A
Patent Document 3: JP 2012-46772 A
Patent Document 4: JP 5397794 B
Patent Document 5: JP 2014-63973 A

SUMMARY OF INVENTION

Technical Problem

The mist CVD method does not require high temperature unlike the other CVD methods, but is capable of producing crystal structures in metastable phase, such as the corundum structure of α-gallium oxide. For the production of α-gallium oxide, gallium acetylacetonate, gallium bromide, and gallium iodide, etc. are used as a gallium source. Such materials are comparatively expensive, and there are also concerns for stability of supply. From such viewpoints, gallium chloride or a solution of metallic gallium in hydrochloric acid are inexpensive materials, and a stable supply of the materials can be expected, and therefore, are options for materials used in the mist CVD method.

However, when the present inventors conducted a study using materials containing gallium chloride or hydrochloric acid, the present inventors found out that there is a problem that film forming speed is considerably degraded compared with cases where the above-described materials are used.

The present invention has been made to solve the above-described problems, and an object thereof is to provide a method for manufacturing an α-gallium oxide film of low cost and excellent film forming speed in a mist CVD method.

Solution to Problem

The present invention has been made to achieve the above-described object, and provides a method for manufacturing a gallium oxide film where a mist generated by atomizing a raw-material solution or by forming a raw-material solution into droplets is conveyed using a carrier gas, the mist is heated, and the mist is subjected to a thermal reaction on the substrate to form a film, wherein as the raw-material solution, a raw-material solution containing at least a chloride ion and a gallium ion is used, and the mist is heated for 0.002 seconds or more and 6 seconds or less.

According to such a method for manufacturing a gallium oxide film, the problem of film forming speed being degraded can be improved, and a gallium oxide film can be manufactured at low cost.

In this event, the mist can be heated for 0.02 seconds or more and 0.5 seconds or less in the method for manufacturing a gallium oxide film.

In this way, a higher film forming speed can be achieved stably.

In this event, the mist can be heated for 0.07 seconds or more and 0.3 seconds or less in the method for manufacturing a gallium oxide film.

In this way, a higher film forming speed can be achieved more stably.

In this event, a heating temperature of the substrate for subjecting the mist to a thermal reaction can be 100° C. or higher and 600° C. or lower in the method for manufacturing a gallium oxide film.

In this way, a gallium oxide film can be formed at low cost more certainly.

In this event, as the substrate, a plate-like substrate whose surface for forming a film on has an area of 100 $mm^2$ or more can be used in the method for manufacturing a gallium oxide film.

In this way, a gallium oxide film with a large area can be obtained at low cost.

Advantageous Effects of Invention

As described above, according to the inventive method for manufacturing a gallium oxide film, degradation of film forming speed can be improved, and a gallium oxide semiconductor film can be manufactured at low cost.

BRIEF DESCRIPTION OF DRAWINGS

FIG. 1 is a schematic configuration diagram showing an example of a film forming apparatus used in a film forming method according to the present invention.

FIG. 2 is a diagram for explaining an example of an atomizer in the film forming apparatus.

FIG. 3 is a diagram showing mist heating regions.

FIG. 4 is a graph showing a relation of film forming speed to carrier-gas flow rate Q.

FIG. 5 is a graph showing a relation of film forming speed to heating time T of mist.

DESCRIPTION OF EMBODIMENTS

Hereinafter, the present invention will be described in detail, but the present invention is not limited thereto.

As noted above, there is a demand for a method for manufacturing an α-gallium oxide film at low cost with excellent film forming speed in a mist CVD method.

The present inventors have earnestly studied the above-described problems, and consequently conceived a method for manufacturing a gallium oxide film where a mist generated by atomizing a raw-material solution or by forming a raw-material solution into droplets is conveyed using a carrier gas, the mist is heated, and the mist is subjected to a thermal reaction on the substrate to form a film, wherein as the raw-material solution, a raw-material solution containing at least a chloride ion and a gallium ion is used, and the mist is heated for 0.002 seconds or more and 6 seconds or less. According to this method, the problem of film forming speed being degraded can be improved, and a gallium oxide film can be manufactured at low cost. Thus, the present invention has been completed.

Here, "mist" in the present invention is a general term of fine particles of a liquid dispersed in a gas, and also means what is called fog, droplet, etc.

Hereinbelow, the description will be given with reference to the drawings.

FIG. 1 shows an example of a film forming apparatus 101 usable in the method for manufacturing a gallium oxide film according to the present invention. The film forming apparatus 101 includes: an atomizer 120 configured to atomize a raw-material solution to generate a mist; a carrier-gas supplier 130 configured to supply a carrier gas by which a mist is conveyed; a film-forming unit 140 configured to heat a mist to form a film on a substrate; and a conveyor 109 configured to connect the atomizer 120 to the film-forming unit 140 and convey a mist by using a carrier gas. Moreover, the film forming apparatus 101 may include a controller (not shown) configured to control all or some parts of the film forming apparatus 101 so as to control the operation thereof.
(Raw-Material Solution)

One characteristic of the present invention is that at least a gallium ion and a chloride ion are contained as raw materials used for manufacturing a gallium oxide film. Such materials are inexpensive, and are excellent in stability of supply.

The raw-material solution 104a is not particularly limited as long as at least a gallium ion and a chloride ion are contained. That is, besides gallium, one or more kinds of ion of a metal selected from iron, indium, aluminum, vanadium, titanium, chromium, rhodium, iridium, nickel, and cobalt can be contained, for example.

The raw-material solution 104a is not particularly limited, as long as the metal(s) can be atomized. It is possible to suitably use the raw-material solution 104a in which the aforementioned metal(s) are dissolved or dispersed in a form of complex or salt in water. Examples of the complex form include acetylacetonate complexes, carbonyl complexes, ammine complexes, hydrido complexes, etc. Examples of the salt form include metal chloride salts, metal bromide salts, metal iodide salts, etc. Moreover, solutions obtained by dissolving the metals in hydrobromic acid, hydrochloric acid, hydroiodic acid, or the like can be used as aqueous solutions of the salts.

Furthermore, an acid may be mixed with the raw-material solution 104a. Examples of the acid include hydrohalic acids such as hydrobromic acid, hydrochloric acid, and hydroiodic acid; halogen oxoacids such as hypochlorous acid, chlorous acid, hypobromous acid, bromous acid, hypoiodous acid, and iodic acid; carboxylic acids such as formic acid; and nitric acid, etc.

When a material other than hydrochloric acid or gallium chloride is used, it is necessary to mix at least hydrochloric acid as well so that a gallium ion and a chloride ion are present, as described above. Considering cost, a solution of metallic gallium in hydrochloric acid or a gallium chloride aqueous solution is the most preferable.

Furthermore, the raw-material solution may contain a dopant for controlling the electric characteristics of the gallium oxide film. In this way, the gallium oxide film can be easily used as a semiconductor film. The dopant is not particularly limited. Examples thereof include n-type dopants, such as tin, germanium, silicon, titanium, zirconium, vanadium, and niobium; and p-type dopants, such as copper, silver, tin, iridium, and rhodium; etc. The dopant concentration may be, for example, approximately $1\times10^{16}/cm^3$ to $1\times10^{22}/cm^3$, may be a low concentration of approximately $1\times10^{17}/cm^3$ or less, or may be a high concentration of approximately $1\times10^{20}/cm^3$ or more.
(Atomizer)

In the atomizer 120, the raw-material solution 104a is atomized to generate a mist. The atomization means is not particularly limited and may be known atomization means, as long as the raw-material solution 104a can be atomized. It is preferable to use atomization means utilizing ultrasonic vibration. This is because more reliable atomization is possible.

FIG. 2 shows an example of such an atomizer 120. The atomizer 120 may include, for example, a mist generation source 104 where the raw-material solution 104a is housed; a container 105 where a medium, for example, water 105a, capable of transmitting ultrasonic vibration is put; and an ultrasonic transducer 106 attached to a bottom surface of the container 105. A more specific configuration is as follows. The mist generation source 104 is a container for housing the raw-material solution 104a. By using a support (not shown), the mist generation source 104 is accommodated in the container 105, in which the water 105a is housed. The ultrasonic transducer 106 is provided at a bottom portion of the container 105. The ultrasonic transducer 106 is connected to an oscillator 116. Further, when the oscillator 116 is activated, the ultrasonic transducer 106 vibrates, and the ultrasonic wave propagates into the mist generation source 104 through the water 105a, so that the raw-material solution 104a is atomized.
(Conveyor)

The conveyor 109 connects the atomizer 120 to the film-forming unit 140. Through the conveyor 109, a carrier gas conveys a mist from the mist generation source 104 of the atomizer 120 to the film forming chamber 107 of the film-forming unit 140. The conveyor 109 may be, for example, a supply tube 109a. As the supply tube 109a, for example, a quartz tube, a resin-made tube, etc. are usable.
(Film-Forming Unit)

In the film-forming unit 140, a mist is heated to cause a thermal reaction to form a film on a portion or the entire surface of a substrate 110. The film-forming unit 140 may include, for example, a film forming chamber 107, and in the film forming chamber 107, the substrate 110 is disposed; and a hot plate 108 configured to heat the substrate 110. The hot plate 108 may be provided outside the film forming chamber 107 as shown in FIG. 1, or may be provided inside the film forming chamber 107. Moreover, the film forming chamber 107 may be provided with an exhaust-gas discharge port 112 at such a position not to influence the mist supply to the substrate 110. Furthermore, in the present invention, the substrate 110 may face downward, for example, by disposing it on a ceiling portion of the film forming chamber 107. Alternatively, the substrate 110 may face upward by disposing it on a bottom surface of the film forming chamber 107.

It is only necessary that the thermal reaction should cause a mist to undergo reaction by heating, and the reaction conditions etc. are not particularly limited. The conditions can be appropriately set according to the raw material, etc. By heating the substrate 110 with the hot plate 108, the mist present near the substrate 110 can be heated. In this manner, the mist can be heated easily without providing a complicated heating mechanism. In addition, as described below, the time for heating the mist can be controlled easily in such a heating method.

The temperature for heating the substrate 110 is preferably 100 to 600° C. Within such a temperature range, it is possible to heat to a temperature at which the mist undergoes a thermal reaction more certainly, and a gallium oxide film can be formed at low cost. The temperature is preferably 200° C. to 600° C., further preferably 300° C. to 550° C.

The thermal reaction may be carried out under any atmosphere of vacuum, non-oxygen atmosphere, reducing gas atmosphere, air atmosphere, and oxygen atmosphere. The atmosphere can be appropriately set depending on a film to be formed. In addition, regarding the reaction pressure condition, the reaction may be performed under pressure, reduced pressure, or atmospheric pressure. A film is preferably formed under atmospheric pressure because this allows simplified apparatus configuration.

(Substrate)

The substrate 110 is not particularly limited, as long as it allows film formation thereon and can support the film. The material of the substrate 110 is not particularly limited, either, and known substrates can be used. The substrate 110 may be an organic compound or inorganic compound. Examples thereof include, but are not limited to, polysulfone, polyether sulfone, polyphenylene sulfide, polyether ether ketone, polyimide, polyether imide, fluorinated resin; metals, such as iron, aluminum, stainless steel, and gold; silicon, sapphire, quartz, glass, gallium oxide, etc. Regarding the shape, the substrate may be any shape. The present invention is effective for any shape. Examples of the shape include plate-like shapes such as flat plate and disk, fibrous, rod-like, columnar, prismatic, cylindrical, helical, spherical, annular shapes, etc. In the present invention, a plate-like substrate is preferable. The thickness of the plate-like substrate is not particularly limited, but is preferably 10 to 2000 μm, more preferably 50 to 800 μm. When the substrate is plate-like, the surface for forming a film on has an area of preferably 100 mm$^2$ or more. More preferably, the diameter is 2 inches (50 mm) or more. By using such a substrate, an α-gallium oxide film with a large area can be obtained at low cost. The upper limit of the area of the surface for forming a film on is not particularly limited, but can be, for example, 71000 mm$^2$ or less.

(Carrier-Gas Supplier)

The carrier-gas supplier 130 may include a carrier gas source 102a configured to supply a carrier gas; and a flow-rate adjustment valve 103a configured to adjust a flow rate of a carrier gas (hereinafter referred to as "main carrier gas") sent out from the carrier gas source 102a. Moreover, as necessary, the carrier-gas supplier 130 can further include a diluent-carrier gas source 102b configured to supply a diluent carrier gas; and a flow-rate adjustment valve 103b configured to adjust a flow rate of a diluent carrier gas sent out from the diluent-carrier gas source 102b.

The type of the carrier gases is not particularly limited, and can be selected appropriately depending on a film to be formed. Examples of the carrier gases include oxygen, ozone; inert gases, such as nitrogen and argon; reducing gases, such as hydrogen gas and forming gas; etc. Additionally, regarding the type of the carrier gases, one type or two or more types may be used. For example, besides a first carrier gas, it is possible to additionally use a second carrier gas, such as a dilution gas that is prepared by diluting (for example, 10 fold dilution) a first carrier gas with another gas. Air can also be used. Moreover, the number of positions where the carrier gas(es) are supplied is not limited to one, and may be two or more.

In the present description, a flow rate Q of a carrier gas(es) refers to a total flow rate of the carrier gas(es) used. In the above example, a total flow rate of the flow rate of the main carrier gas sent out from the carrier gas source 102a and the flow rate of the diluent carrier gas sent out from of the diluent-carrier gas source 102b is the flow rate Q of the carrier gases.

(Film Forming Method)

Next, an example of the inventive method for manufacturing a gallium oxide film will be described with reference to FIG. 1.

First, the raw-material solution 104a is housed in the mist generation source 104 of the atomizer 120. The substrate 110 is disposed on the hot plate 108 directly or with a wall of the film forming chamber 107 interposed therebetween, and the hot plate 108 is activated.

Next, the flow-rate adjustment valves 103a and 103b are opened to supply the carrier gases originated from the carrier gas sources 102a and 102b into the film forming chamber 107. The atmosphere of the film forming chamber 107 is sufficiently replaced with the carrier gases, and the flow rate of the main carrier gas and the flow rate of the diluent carrier gas are each adjusted to control the carrier-gas flow rate Q.

In a step of generating a mist, the ultrasonic transducer 106 is vibrated, and this vibration is propagated to the raw-material solution 104a through the water 105a. Thereby, the raw-material solution 104a is atomized and a mist is generated. Next, in a step of conveying the mist with the carrier gases, the mist is conveyed from the atomizer 120 via the conveyor 109 to the film-forming unit 140 by the carrier gases, and introduced into the film forming chamber 107. In a step of forming a film, the mist introduced in the film forming chamber 107 is heated for the thermal reaction in the film forming chamber 107 by heat of the hot plate 108, so that a film is formed on the substrate 110.

Here, the investigation results of the relation of the film forming speed of the gallium oxide film to the heating time T of mist will be described.

As described in the explanation regarding thermal reaction, it can be considered that the mist is heated in the space including a heating surface inside the film forming chamber 107. Hereinafter, this space will be referred to as a "mist heating region". FIGS. 3(a) to (e) show specific examples of the structure of the film forming chamber 107 in the film-forming unit 140. Note that in FIG. 3, the substrate is omitted. As shown in FIG. 3, the space (the shaded region) spanned by the heating surface in a vertical direction inside the film forming chamber 107 is a mist heating region 500. FIGS. 3(a), (c), and (e) are examples where a partial region inside the film forming chamber 107 is a mist heating region 500, and FIGS. 3(b) and (d) are examples where the entire region inside the film forming chamber 107 is a mist heating region 500.

By adjusting the carrier-gas flow rate Q, the time that the mist, being the film forming raw material, stays in the mist heating region 500 can be adjusted. Since the mist is heated while retained in the mist heating region 500, the time T to heat the mist is equal to the time that the mist stays in the mist heating region 500. That is, when the volume of the mist heating region 500 is V, V÷Q, equivalent to the retention time is equivalent to the time T to heat the mist (T=V/Q).

Firstly, the relation of film forming speed to carrier-gas flow rate Q was investigated using film forming chambers with different heights. The heights of the film forming chambers were the three types: 0.5 cm, 0.09 cm, and 0.9 cm. The heating surface area of the hot plate was the same: 113 cm$^2$. That is, the volume V of the mist heating region was respectively 57 cm$^3$, 10 cm$^3$, and 102 cm$^3$.

FIG. 4 shows the relation of film forming speed to the carrier-gas flow rate Q. The horizontal axis is the carrier-gas flow rate Q (L/minute), and the vertical axis is the film forming speed (μm/hour). As noted, each plot corresponds to the volume V (57 cm$^3$, 10 cm$^3$, and 102 cm$^3$) of the mist heating region. As clearly seen from FIG. 4, the film forming speed distribution has a peak at which the film forming speed distribution became maximum whatever the height of the film forming chamber (the volume of the mist heating region), and it was revealed that there are conditions that raise the film forming speed in relation to the carrier-gas flow rate Q.

Using this result, the retention time of the mist in the mist heating region 500 ("volume of mist heating region 500 V"÷"carrier-gas flow rate Q"), that is, the time T to heat the mist was calculated. FIG. 5 shows a graph with the time T (seconds) to heat the mist plotted on the horizontal axis. As noted, each plot corresponds to the volume V of the mist heating region (57 cm$^3$, 10 cm$^3$, and 102 cm$^3$). As shown in FIG. 5, it was revealed that when the time T to heat the mist is set to 0.002 seconds or more and 6 seconds or less, a gallium oxide film can be manufactured at a high film forming speed even when a solution containing at least a gallium ion and a chloride ion is a starting material.

It can be considered that if the time T to heat the mist is too short (less than 0.002 seconds), the mist is discharged from the furnace before a reaction can take place. On the other hand, if the time T to heat the mist is too long (over 6 seconds), reaction (evaporation) of the mist progresses inside the furnace, and reaction does not occur on the substrate.

An aqueous halide solution forms an azeotrope with water. In particular, chloride has a low azeotropic temperature compared with bromide or iodide. For this reason, it can be interpreted that the mist evaporates faster than with bromide or iodide (that is, chloride evaporates easily), and under similar conditions to when a conventional material is used, film forming speed is considerably degraded. The time T to heat the mist is preferably 0.02 seconds or more and 0.5 seconds or less, more preferably 0.07 seconds or more and 0.3 seconds or less.

EXAMPLE

Hereinafter, the present invention will be described in detail with reference to Examples, but the present invention is not limited thereto.

Example 1

Based on the above-described investigation results, a corundum-structured gallium oxide (α-gallium oxide) film was formed.

Firstly, an aqueous solution containing 0.1 mol/L of gallium chloride was prepared, and this served as the raw-material solution 104a. This raw-material solution 104a was housed in the mist generation source 104. Next, as the substrate 110, a 4-inch (diameter: 100 mm) c-plane sapphire substrate was disposed in the film forming chamber 107 so as to abut on the hot plate 108. The hot plate 108 was activated to raise the temperature to 500° C. Since the heating surface area of the hot plate 108 was 113 cm$^2$ and the height inside the film forming chamber was 0.5 cm, the volume of the mist heating region 500 was 57 cm$^3$.

Subsequently, the flow-rate adjustment valves 103a and 103b were opened to supply oxygen gas as carrier gases from the carrier gas sources 102a and 102b into the film forming chamber 107. The atmosphere of the film forming chamber 107 was sufficiently replaced with the carrier gases. Subsequently, the flow rate of the main carrier gas was adjusted to 0.4 L/minute and the flow rate of the diluent carrier gas was adjusted to 16 L/minute, so that the carrier-gas flow rate Q was adjusted to 16.4 L/minute. The mist is heated for 0.21 seconds in this case.

Next, the ultrasonic transducer 106 was vibrated at 2.4 MHz. The vibration was propagated to the raw-material solution 104a through the water 105a, so that the raw-material solution 104a was atomized to generate a mist. This mist was introduced into the film forming chamber 107 via the supply tube 109a by the carrier gases. Then, under conditions of atmospheric pressure and 500° C., the mist was subjected to thermal reaction in the film forming chamber 107. Thus, a thin film of α-gallium oxide was formed on the substrate 110. The film-formation time was 30 minutes.

The film thickness of the thin film obtained on the substrate 110 was measured using a spectrometric film-thickness measurement system. 17 points within the plane of the substrate 110 were set as measurement points, and an average value was calculated to obtain an average film thickness. The obtained average film thickness was divided by the film-formation time: 30 minutes. The resulting value was regarded as the film forming speed.

In addition, an X-ray diffraction measurement was conducted on the obtained thin film of α-gallium oxide to evaluate crystallinity. Specifically, a rocking curve of a (0006) plane diffraction peak of the α-gallium oxide was measured, and the full width at half maximum thereof was obtained.

Comparative Example 1

A film was formed and evaluated under the same conditions as in Example 1, except that the time to heat the mist was set to 8.55 seconds by setting the flow rate of the diluent carrier gas to 0 L/minute, and the flow rate of the carrier-gas flow rate Q to 0.4 L/minute.

Example 2

A film forming chamber with a height inside the film forming chamber of 0.09 cm with the heating surface area of the hot plate 108 still at 113 cm² (volume of mist heating region=10 cm³) was used. In addition, the flow rate of the main carrier gas was adjusted to 0.08 L/minute and the flow rate of the diluent carrier gas was adjusted to 2.82 L/minute, so that the carrier gas flow rate Q was adjusted to 2.9 L/minute. The mist is heated for 0.21 seconds in this case. Other than these conditions, a film was formed and evaluated under the same conditions as in Example 1.

Comparative Example 2

A film was formed and evaluated under the same conditions as in Example 2, except that the flow rate of the diluent carrier gas was set to 0 L/minute, and the carrier-gas flow rate Q to 0.08 L/minute, so that the mist was heated for 7.50 seconds.

Example 3

A film forming chamber with a height inside the film forming chamber of 0.9 cm with the heating surface area of the hot plate 108 still at 113 cm² (volume of mist heating region=102 cm³) was used. In addition, the flow rate of the main carrier gas was adjusted to 0.8 L/minute and the flow rate of the diluent carrier gas was adjusted to 28.7 L/minute, so that the carrier gas flow rate Q was adjusted to 29.5 L/minute. The mist is heated for 0.21 seconds in this case. Other than these conditions, a film was formed and evaluated under the same conditions as in Examples 1 and 2.

Comparative Example 3

A film was formed and evaluated under the same conditions as in Example 3, except that the flow rate of the diluent carrier gas was set to 0 L/minute, and the carrier-gas flow rate Q to 0.8 L/minute, so that the mist was heated for 7.65 seconds.

Table 1 shows the evaluation results of Examples 1 to 3 and Comparative Examples 1 to 3. It can be observed that in Examples 1 to 3, the film forming speed is remarkably higher than in Comparative Examples 1 to 3.

In addition, the full width at half maximum was smaller in each of the Examples 1 to 3 than in Comparative Examples 1 to 3, and it was revealed that crystallinity had been greatly improved. It can be conjectured that if the mist is heated for a long time as in Comparative Examples 1 to 3, water in the mist evaporates before reaching the substrate disposed inside the furnace, a powder is formed, and this adheres to the substrate, degrading crystallinity. It was revealed that by shortening the time to heat the mist, formation of a powder as described above can be suppressed, and α-gallium oxide with excellent crystallinity can be formed.

TABLE 1

|  | Volume of mist heating region (cm³) | Carrier-gas flow rate Q (L/minute) | Time to heat mist (seconds) | Film forming speed (μm/hour) | Full width at half maximum (seconds) |
| --- | --- | --- | --- | --- | --- |
| Example 1 | 57 | 16.4 | 0.21 | 0.58 | 69 |
| Comparative Example 1 | 57 | 0.4 | 8.55 | 0.03 | 192 |
| Example 2 | 10 | 2.9 | 0.21 | 0.61 | 62 |
| Comparative Example 2 | 10 | 0.08 | 7.50 | 0.12 | 168 |
| Example 3 | 102 | 29.5 | 0.21 | 0.60 | 64 |

TABLE 1-continued

|  | Volume of mist heating region (cm³) | Carrier-gas flow rate Q (L/minute) | Time to heat mist (seconds) | Film forming speed (μm/hour) | Full width at half maximum (seconds) |
| --- | --- | --- | --- | --- | --- |
| Comparative Example 3 | 102 | 0.8 | 7.65 | 0.04 | 181 |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a gallium oxide film, the method comprising:
   conveying a mist to a mist heating region using a carrier gas, the mist being a fog composed of fine particles of a liquid dispersed in a gas and having been generated by atomizing a raw-material solution or by forming a raw-material solution into droplets;
   heating the mist in the mist heating region, and subjecting the mist to a thermal reaction on a heated substrate in the mist heating region to form a gallium oxide film,
   wherein:
   the raw-material solution comprises a chloride ion and a gallium ion, and
   the mist is heated in the mist heating region for a heating time T of 0.002 seconds or more and 6 seconds or less.

2. The method for manufacturing a gallium oxide film according to claim 1, wherein the mist is heated in the mist heating region for 0.02 seconds or more and 0.5 seconds or less.

3. The method for manufacturing a gallium oxide film according to claim 2, wherein the mist is heated in the mist heating region for 0.07 seconds or more and 0.3 seconds or less.

4. The method for manufacturing a gallium oxide film according to claim 3, wherein a heating temperature of the heated substrate is 100° C. or higher and 600° C. or lower.

5. The method for manufacturing a gallium oxide film according to claim 4, wherein the heated substrate is a plate-shaped substrate whose surface for forming the gallium oxide film on has an area of 100 mm² or more.

6. The method for manufacturing a gallium oxide film according to claim 3, wherein the heated substrate is a plate-shaped substrate whose surface for forming the gallium oxide film on has an area of 100 mm² or more.

7. The method for manufacturing a gallium oxide film according to claim 2, wherein a heating temperature of the heated substrate is 100° C. or higher and 600° C. or lower.

8. The method for manufacturing a gallium oxide film according to claim 7, wherein the heated substrate is a plate-shaped substrate whose surface for forming the gallium oxide film on has an area of 100 mm² or more.

9. The method for manufacturing a gallium oxide film according to claim 2, wherein the heated substrate is a plate-shaped substrate whose surface for forming the gallium oxide film on has an area of 100 mm² or more.

10. The method for manufacturing a gallium oxide film according to claim 1, wherein the mist is heated in the mist heating region for 0.07 seconds or more and 0.3 seconds or less.

11. The method for manufacturing a gallium oxide film according to claim 10, wherein a heating temperature of the heated substrate is 100° C. or higher and 600° C. or lower.

12. The method for manufacturing a gallium oxide film according to claim 11, wherein the heated substrate is a plate-shaped substrate whose surface for forming the gallium oxide film on has an area of 100 mm$^2$ or more.

13. The method for manufacturing a gallium oxide film according to claim 10, wherein the heated substrate is a plate-shaped substrate whose surface for forming the gallium oxide film on has an area of 100 mm$^2$ or more.

14. The method for manufacturing a gallium oxide film according to claim 1, wherein a heating temperature of the heated substrate is 100° C. or higher and 600° C. or lower.

15. The method for manufacturing a gallium oxide film according to claim 14, wherein the heated substrate is a plate-shaped substrate whose surface for forming the gallium oxide film on has an area of 100 mm$^2$ or more.

16. The method for manufacturing a gallium oxide film according to claim 1, wherein the heated substrate is a plate-shaped substrate whose surface for forming the gallium oxide film on has an area of 100 mm$^2$ or more.

17. The method for manufacturing a gallium oxide film according to claim 1, wherein T=V/Q, where:
  V is a volume of the mist heating region in which the mist is heated, and
  Q is a flow rate of the carrier gas.

18. The method for manufacturing a gallium oxide film according to claim 1, wherein the heating time T is 0.02 seconds or more and 0.5 seconds or less.

19. The method for manufacturing a gallium oxide film according to claim 1, wherein the heating time T is 0.07 seconds or more and 0.3 seconds or less.

* * * * *